United States Patent [19]

Croset et al.

[11] Patent Number: 4,540,452
[45] Date of Patent: Sep. 10, 1985

[54] PROCESS FOR MANUFACTURING A SEMI-CONDUCTOR DEVICE OF THE TYPE COMPRISING AT LEAST ONE SILICON LAYER DEPOSITED ON AN INSULATING SUBSTRATE

[75] Inventors: Michel Croset, Palaiseau; Dominique Dieumegard, Mareil-Marly; Didier Pribat, Paris, all of France

[73] Assignee: Thomson-CSF, Paris, France

[21] Appl. No.: 587,641

[22] Filed: Mar. 8, 1984

[30] Foreign Application Priority Data

Mar. 11, 1983 [FR] France ............................... 83 04051

[51] Int. Cl.³ ..................... H01L 21/20; H01L 21/76
[52] U.S. Cl. ................................. 148/175; 29/576 T; 29/576 E; 148/1.5; 148/189; 148/191; 148/DIG. 3; 148/DIG. 77; 148/DIG. 150; 148/DIG. 117; 156/612; 156/613; 156/614; 156/DIG. 64; 156/DIG. 73; 156/DIG. 95; 357/4; 357/49
[58] Field of Search ............... 148/1.5, 175, 187, 189, 148/191; 156/612, 613, 614, DIG. 95, DIG. 64, DIG. 73; 357/4, 49; 29/576 T, 576 E

[56] References Cited

U.S. PATENT DOCUMENTS

| | | | |
|---|---|---|---|
| 4,016,006 | 4/1977 | Yoshinaka et al. | 148/1.5 |
| 4,147,584 | 4/1979 | Garrison et al. | 156/614 X |
| 4,177,084 | 12/1979 | Lau et al. | 148/175 X |
| 4,177,321 | 12/1979 | Nishizawa | 148/175 X |
| 4,275,093 | 6/1981 | Sasaki et al. | 156/DIG. 64 |
| 4,447,497 | 5/1984 | Manasevit | 156/612 X |

Primary Examiner—William G. Saba
Attorney, Agent, or Firm—Oblon, Fisher, Spivak, McClelland & Maier

[57] ABSTRACT

The invention provides a process comprising a step for depositing at least one intrinsic or doped monocrystalline silicon layer on a substrate, also monocrystalline, followed by a step for forming a thin silica layer at the level of the original substrate-silicon interface. The silica layer is obtained by oxidation through the substrate, followed by a heat treatment step during which the monocrystalline silicon is oxidized by the implanted oxygen ions. The first approach may take place according to two variants: thermal or plasma oxidation of the silicon-substrate interface. Oxidation takes place during the return to ambient temperature of the stack of layers after the deposit has been made.

6 Claims, 5 Drawing Figures

PROCESS FOR MANUFACTURING A SEMI-CONDUCTOR DEVICE OF THE TYPE COMPRISING AT LEAST ONE SILICON LAYER DEPOSITED ON AN INSULATING SUBSTRATE

BACKGROUND OF THE INVENTION

1. Field of the Invention

The present invention relates to semi-conductor devices manufactured according to the technology for forming components or integrated circuits from thin monocrystalline layers of silicon deposited on an insulating substrate. Numerous studies have been made, more especially during the last 15 years or so, to succeed in mastering this technology. The anticipated advantages are, in theory, multiple. The following advantages may for example be mentioned:

The components or circuit parts formed in the thin layer are easily insulated electrically from each other by chemical cutting instead of by using dielectric layers (in general silica) or p/n junctions as is the case for traditional technologies based on solid silicon. The fact of doing away with insulation by a junction considerably increases the resistance to ionizing radiations, by reducing the number of active electron-hole pairs created, which is an essential quality for electronic elements placed in a severe environment.

The parasite connection capacity between active components due to the solid dielectric substrate is very low, thus contributing to the design of rapid logic circuits or ultra high frequency circuits. Moreover, the junction capacities are also eliminated.

The insulating substrate technology is simpler than that using solid monocrystalline silicone. Thus a circuit may be formed by this technology using a procedure which only requires 6 to 8 masking levels; an equilvalent circuit formed in the traditional technology requires 16 to 20 masking levels. Furthermore, the surface gain is estimated at about 30%.

Finally, in structures of the CMOS on solid silicon type, the problemn known under the name of "latch-up effect" that is to say the appearance of a parasite bi polar transistor, may also be eliminated by using an insulating substrate.

2. Description of the Prior Art

In the Prior Art, two types of insulating substrates have been tested: amorphous substrates and monocrystalline substrates. In the first case, the monocrystalline crystalization of the deposited silicon is promoted, either by one or more nuclei or by the definition of a network of parallel lines on the surface of the substrate, imposing a preferential crystallographic orientation (which technique is called "graphoepitaxy").

If the crystallographic orientation is not obtained at the time of depositing, it may be obtained by subsequent treatment: reheating, with or without remelting of the deposited silicon layer for example.

In the state of development of the technology, with this approach monocrystalline zones having an area of a few square millimeters have been obtained. Crystallized zones of a few square centimeters have even been obtained which only comprise sub-joints of nuclei which do not seem to have a determining influence on the electric properties of the material or of the structures formed. This is the case more particularly with the "MOSFET" structures.

In the second case, monocrystalline insulating substrates serve as coherent nuclei for the growth of the layer. This latter is therefore monocrystalline as a whole.

The conditions which the substrates must satisfy are of a physical kind: in particular, crystalline mesh and expansion coefficient close to those of the layer and of a chemical kind: thermo stabiliy and absence of reactivity with a layer and the environment, that is to say more concretely, with the atmosphere reigning in the enclosure of the reactor used for the manufacture.

With a view to growing thin silicon layers, several substrates have been tested such as quartz, spinel, corindon or sapphire. Only this latter has given rise to industrial development. The technology is known under the name "SOS" ("silicon on sapphire"). In fact, although from the point of view of the electric quality of the substratelayer interface, quartz is theoretically preferable, from a crystollographic point of view silicon deposited on quartz is of very poor quality. It appears from experience that corindon is better than ($Al_2O_3MgO$). However, the electric characteristics of "SOS" type structures are mediocre: uncontrolled and thermally unstable doping, low mobility and high interfacial recombination rate. These effects limit the preformances of "SOS" circuits, in particular for bipolar circuits and for ultra high frequency applications. These circuits are only interesting when they are used as so called "hardened" circuits, that is to say insensitive to ionizing radiation.

The mediocre qualities of "SOS" type circuits may be explained by the nature of the alumina-silicon interface. This interface is not perfect from an electric point of view. There exists a high interface state density which modifies the conductivity of the interfacial zone. Low interface-charge density, typically less than $10^{11}$ per $Cm^2$, is desirable. Furthermore, alumina tends to be reduced by the silane in the presence of hydrogen and consequently the silicon layer contains not inconsiderable amounts of aluminium, more or less oxidized, being thus in a substitutional position for the silicon network. Considerations of cost must also be taken into account, for the price of a sapphire substrate is relatively high with respect to the conventional substrate, even if this extra cost is partly offset by the greater simplicity of manufacture of the circuit, as was mentioned above.

From the experience acquired from the above mentioned studies, the following lessons may be drawn: the theoretical advantages of this technology would only be industrially useable if:

the electric properties of the silicon layer correspond to those of the solid material, bounded by two neighboring ideal surfaces;

the steps of traditional technology on solid silicon for obtaining circuits with very high integration densities are applicable within the framework of the technology of depositing on an insulating substrate, without impairing the properties of the solid silicon.

From the practical point of view, that gives rise to the following requirements:

the substrate must be chemically inert with respect to the treatment atmospheres and with respect to the silicon, up to temperatures at least equal to 1050° C.

the expansion coefficient of the substrate, at least in the zone close to the interface, must be matched to that of the silicon, a silica layer must be created between the deposited silicon layers and the insulating substrate, this silicon-silica interface being, in the present state of knowledge, recognized as one of the only ones ensuring good electric quality.

This latter requirement cannot be fulfilled by a process which consists simply in creating, successively, a continuous silica layer on the insulating substrate in one or more layers of silicon. Under these conditions, the layers and interfaces created would be of mediocre quality, from the crystallographic characteristic and electric points of view.

It is then apparent that the conventional approach used in the Prior Art does not allow these three points to be satisfied simultaneously.

Furthermore, it has been discovered that, during return to the ambient temperature, after heat treatment or plasma treatment, extensive defects appeared during this cooling phase which are essentially due to imperfect matching of the expansion parameters of the substrate and of the silicon.

According to an important aspect of the invention, the step for oxidizing the silicon layer is performed concurrently with cooling of the materials.

The aim of the invention is to satisfy this need and proposes a manufacturing process satisfying these conditions and providing silicon layers of good electric quality, the layer remaining compatible with the rest of the technology on solid silicon and allowing a circuit to be obtained with very high integration density.

SUMMARY OF THE INVENTION

The object of the invention is then a process for manufacturing a semi-conductor device comprising a step for depositing at least one layer of monocrystalline silicon on a flat substrate made from an insulating material, comprising a further step for forming, by oxidation, a layer of silica of given thickness buried in the monocrystalline silicon, one of the faces of the silica layer being in direct contact with one of the faces of the substrate, wherein the substrate is made from a monocrystalline material selected from those having a crystalline network topology of the same type as that of the silicon and chemically inert with respect to the silicon and the materials used for depositing said silicon layer and wherein, with the depositing step comprising heat treatment at a higher temperature than the ambient temperature, the subsequent oxidation step is effected following this treatment during the time required for returning to the ambient temperature.

BRIEF DESCRIPTION OF THE DRAWINGS

The invention will be better understood and other advantages will appear from reading the following description with reference to the accompanying drawings in which.

DESCRIPTION OF THE PREFERRED EMBODIMENTS

The process of the invention comprises the two following arrangements:

(a) The choice of monocrystalline substrate ensuring the growth of a pure or doped silicon layer, which is perfect from a crystallographic point of view and pure from a chemical point of view, i.e. only containing silicon and dopes voluntarily introduced during growth and having an abrupt interface with the insulating substrate.

(b) the formation a posteriori of thin silica layer at the substrate-silicon interface; this arrangement being the principle feature of the process of the invention. This layer ensures the electric quality of the interface and allows matching of the expansion coefficients between the substrate and the silicon. In addition, it may possibly eliminate a defective zone of the original silicon-substrate interface. It allows the use of traditional technologies used for depositing on solid silicon, even those requiring high temperature treatments. Furthermore, the formation of this layer takes place during the return to the ambient temperature after the depositing step.

The substrate chosen is an ionic conductor of oxygen at a moderate temperature; that is to say in practice at a temperature less than or equal to 1200° C., so as to allow creation of the silica layer by oxidation of the silicon through the substrate.

Figure 1:
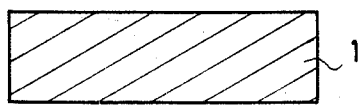
FIGS. 1 to 3 illustrate the principle steps of the process for depositing a silicon layer on an insulating substrate in accordance with the invention.
Figure 2:
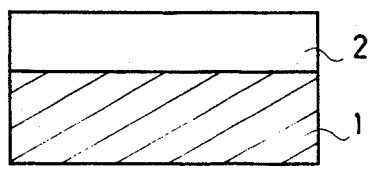
Figure 3:
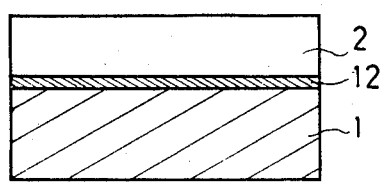

FIGS. 1 to 3 illustrate the main steps of the process of the invention. In FIG. 1 is shown the bare substrate 1, prepared and cleaned by any appropriate techniques of the Prior Art.

In FIG. 2, a layer of pure or doped silicon 2 is deposited on the substrate also according to the known techniques of the Prior Art.

According to the main feature of the invention, a silica layer 12 is created within the silicon layer, as shown in FIG. 3, forming an intermediate layer between the upper part of the deposited silicon layer which remains unchanged and the insulating substrate 1.

The process comprises two main variants: the creation of a silica layer may take place by thermal or plasma oxidation of the deposited silicon-substrate interface.

In all these variants, for forming the substrate a material is chosen satisfying the above mentioned conditions and which is an ionic conductor of oxygen at a moderate temperature, i.e. less than or equal to 1200° C., so as to allow a silica layer to be created by oxidation of the silicon through the substrate.

An example of a material perfectly suitable for this use is doped zirconia, for example with yttrium oxide of the formula:

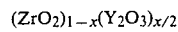

$$(ZrO_2)_{1-x}(Y_2O_3)_{x/2}$$

Doping may also be achieved by means of calcium oxide (CaO).

The characteristics of this material are the following:
the crystalline mesh is cubic, like that of silicon and close thereto. Furthermore, the crystalline parameter can be adjusted by doping. The mesh of the silicon has dimensions equal to 5.43 angstroms; that of zirconia, depending on the doping, varies between 5.14 angstroms and 5.21 angstroms.

zirconia is chemically inert with respect to the atmospheres usually used for the deposits and with respect to silicon, up to very high temperatures.

the linear expansion coefficient of zirconia is close to that of silicon and may also be adjusted by doping. To give an idea, the linear expansion coefficient $\Delta l/l$ of silicon$=3.10^{-6}$ per °C. and that of zirconia is typically equal to $8.10^{-6}$ per °C.

finally, zirconia is an ionic conductor of oxygen at a moderate temperature.

It may be useful to note that doping does not provide simultaneous optimization of the two parameters "expansion coefficient" and "adjusted crystalline mesh". According to the oxidation technology adapted, i.e. the chosen variant, one or other of these parameters will be privileged as will be mentioned hereafter.

The process of the invention comprises, common to both variants, a step for depositing on a previously prepared substrate at least one intrinsic or doped silicon layer. This step may be carried out according to several variants by conventional techniques of the Prior Art. A first technique is depositing by the "CVD" method ("chemical vapor phase deposit"). For this, the substrate is placed in a reactor in which there reigns a high temperature of the order of 700° C. to 1200° C. Following the depositing phase, a monocrystalline layer is obtained directly. A second technique which may be used is evaporation or cathode spraying. Then a polycrystalline silicon layer is obtained and it is necessary to follow up this step with a step for crystallographic reorganization into solid or liquid phase (heat treatment, coherent or incoherent light irradiation, electron beam . . . ) so as to obtain the monocrystalline silicon. Finally, a third technique may be used for depositing called "M.B.E." ("molecular beam epitaxy"). As in the case of "CVD" deposit, a monocrystalline silicon layer is obtained directly.

Following this depositing operation, a monocrystalline silicon layer 2 is then obtained on substrate 1, preferably a doped zirconium substrate. By way of non limiting examples, the substrate has typically a thickness of between 300 micron and 1 mm and the silicon layer a thickness less than or equal to 1 micron and greater than a few tens of nm.

Following this depositing operation, a thin silica layer 12 will be created at the silicon 1- substrate 2 interface by oxidation of the silicon at the level of this interface.

Figure 4:
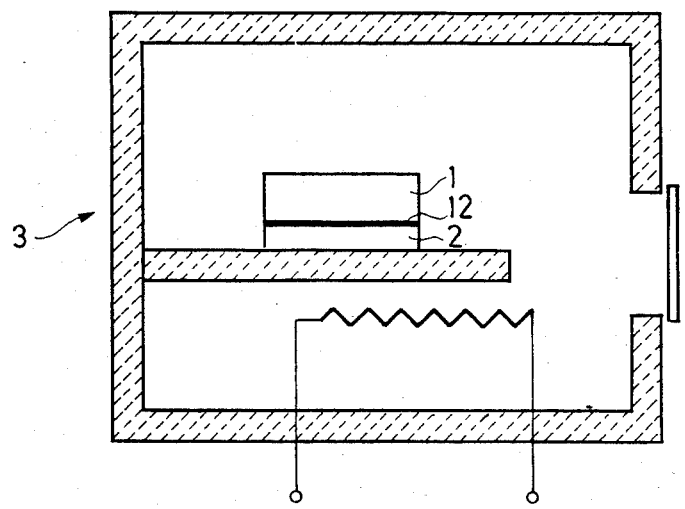
FIGS. 4 to 5 illustrate three variants of the process according to the invention.

According to the first variant, thermal oxidation is used. For this, the assembly of the two layers 1 and 2 is placed in an oven illustrated schematically with reference 3 in FIG. 4. In this oven, oxygen or quite simply air or any non reactive atmosphere containing oxygen is introduced at a normal pressure of 1 atm (101 325 Pa). Since the oxidation kinetics are limited by the transport of oxygen through the silica being formed, the temperature must be sufficiently high so that the treatment time is not excessive, typically the temperature is chosen in a range from 900° to 1200° C. At the interface between the oxygen gas or the air and the substrate, the oxygen molecules separate and diffuse through the doped zirconia substrate 1 as far as the silicon 2-zirconia interface so as to oxidize the silicon there and form a thin silica layer 12. This in no wise disturbs the monocrystalline silicon layer already formed. There is then formed, according to the main feature of the invention, an abrupt silica-silicon interface having the above mentioned qualities.

In this variant, with the treatment temperature high, it is necessary to privilege the "expansion" parameter with respect to the "adjusted crystalline mesh" parameter. In fact, experiments on other materials such as corindum have shown that identity of the mesh parameter between the substrate and the layer was not absolutely indispensable to the monocrystalline growth.

Figure 5:
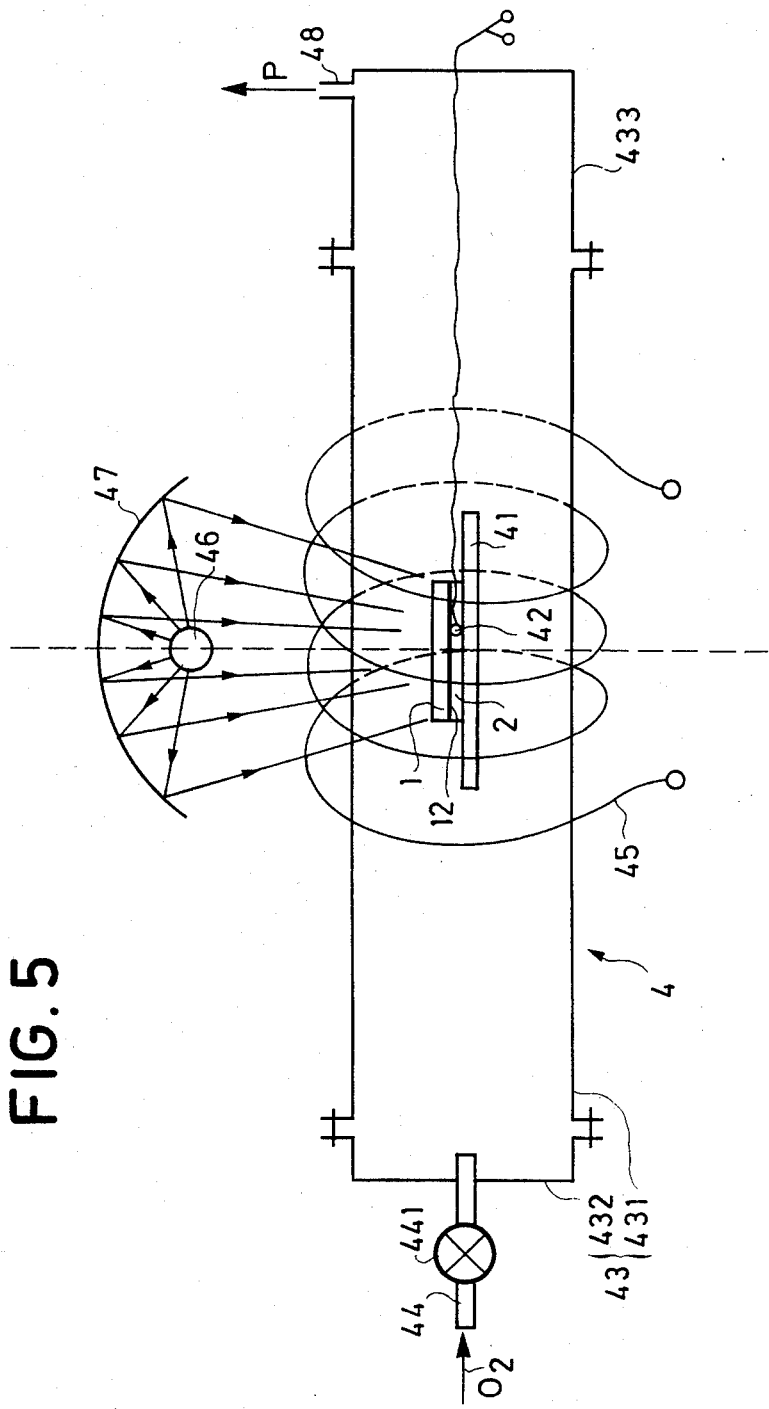

In a second variant illustrated in FIG. 5, the creation of the silica layer takes place by plasma anodic oxidation. This takes place at a moderate temperature, typically between 300° C. and 45° C. In this variant, it is advantageous to privilege the "adjusted crystalline mesh" parameter for matching the two networks as well as possible and ensuring crystalline perfection. It should also be noted, in any case, that after growth of the silica layer, matching of the expansion coefficients between the silicon layers and the substrate is ensured by the silica layer which is of an amorphous type, so very readily deformable. The Silicon on insulating substrate structure thus obtained is compatible with technologies on solid silicon, even with these latter requiring high heat treatment, greater than or equal to 1200° C.

In FIG. 5 is shown an apparatus 4 for plasma treatment so as to obtain oxidation and creation of a silica layer according to a second variant. This apparatus 4 comprises typically:
- a molybdenum or molten silica plate 41 which is used as a support for the stack "1, 12, 2" to be treated;
- a thermocouple 42 which is disposed on support 41 in the immediate vicinity of the layers to be treated. This thermocouple is intended to control the temperature during treatment,
- an enclosure 43 formed, for example, by a molten silica tube 431 closed at its ends by end covers 432 and 433 and through which passes a tube 44 having a smaller diameter than tube 431. This tube is intended to cause a gas stream to flow in the enclosure. The gas is either a pure gas, i.e. oxygen, or a gaseous mixture of oxygen and a rare gas, for example argon. At the other end of tube 431 is disposed a pipe 48 for connecting to a vacuum pump shown symbolically by an arrow marked P, this pump is capable of maintaining the pressure of the gaseous mixture or of the gas in a typical pressure range from $10^{-1}$ to $10^{-2}$ Pascals.
- a coil 45 of conducting wires fed with a high frequency electric current capable of creating a plasma in the region of enclosure 43 in which is placed the stack of layers "1, 12, 2",
- and a radiation heating system comprising a source 46 and a reflector 47 able to reflect the radiations produced by source 46 substantially uniformly over a surface of the order of that of the layer to be treated.

As was mentioned, according to an important aspect of the invention and in the two constructional variants, the step for localized oxidation of the silicon layer is carried out during the period required for cooling after the depositing step. This eliminates to a great extent the formation of extended defects during this cooling phase which are due essentially to an imperfect matching of the expansion parameter of the substrate and of the silicon. These defects may subsequently behave as short circuits for diffusion of the oxygen. The result is then an oxide layer, poorly defined in thickness, which may give rise to high redhibitory interface state densities. As was recalled, efforts are made to obtain interface charge densities less than or equal to $10^{11}$ per $cm^2$. By this method, and interfacial layer is obtained as rapidly as possible which is adapted to withstand stresses due to the heat treatment including the stresses of the first cooling.

As more complete illustration of the process of the invention, typical data for the two variants described have been summed up in a table placed at the end of the present description.

| A.1 Heat oxidation of the silicon | | | |
|---|---|---|---|
| Atmosphere | T °C. | Time | Thickness of oxide SiO$_2$ |
| Humid oxygen | 1200° C. | 20 mn | 5000 Å |
| Dry oxygen | 1200° C. | 4 h | 5000 Å |

| A.2 Plasma oxidation of the silicon | | | | |
|---|---|---|---|---|
| Plasma | T °C. | Time | Oxidation voltage | Thickness of oxide SiO$_2$ |
| Oxygen | 120° C. | 3 mn | 170 v | 1000 Å |

We claim:

1. A process for manufacturing a semi-conductor device comprising a step for depositing at least one layer of monocrystalline silicon on a flat substrate made from an insulating material, comprising a subsequent step for forming by oxidation a layer of silica of given thickness buried within the layer of monocrystalline silicon, one of the faces of the silica layer being in direct contact with one of the faces of the substrate, wherein the substrate is made from a monocrystalline material selected from those having a crystalline network topology of the same type as that of the silicon and chemically inert with respect to the silicon and materials used for depositing said silicon layer and wherein, with the depositing step comprising heat treatment at a temperature higher than the ambient temperature, the subsequent oxidation step takes place after this treatment by exposure to an oxygen containing environment during the time required for returning to ambient temperature, wherein the material forming said substrate is chosen from those having exclusive ionic conduction of the oxygen ion and the step forming the silica is achieved by oxidation of the silicon through the material forming the substrate by means of ionic conduction of the oxygen ions through said material in the region in contact with the surface of the substrate over said given thickness.

2. The process as claimed in claim 1, wherein the oxidation is achieved by heat treatment by exposing the stack comprising at least one silicon layer on an insulating substrate to an atmosphere containing oxygen so as obtain migration of oxygen ion through the thickness of the substrate.

3. The process as claimed in claim 1, wherein oxidation of the silicon is achieved by exposing the stack formed by at least one layer of monocrystalline silicon on an insulating substrate to a plasma containing oxygen in ionic form so as to obtain migration of oxygen ions through the thickness of the substrate.

4. The process as claimed in claim 1, wherein the material of the substrate is doped zirconia.

5. The process as claimed in claim 4, wherein the zirconia is doped with an oxide chosen from yttrium oxide or calcium oxide.

6. The process as claimed in claim 5, wherein doping is determined so as to adjust the elementary dimensions of the crystalline network and the expansion coefficient associated with the zirconia so as to match them to those associated with the silicon.

* * * * *